March 31, 1964 P. P. LOMBARDO 3,127,566

PARAMETRIC AMPLIFIER WITH NO EXTERNAL IDLER CIRCUIT LOADING AND WITH ISOLATION OF SIGNAL AND IDLER FREQUENCIES

Filed June 20, 1961

INVENTOR
PETER P. LOMBARDO

BY [signature]

ATTORNEYS 3,127,566

PARAMETRIC AMPLIFIER WITH NO EXTERNAL IDLER CIRCUIT LOADING AND WITH ISOLATION OF SIGNAL AND IDLER FREQUENCIES

Peter P. Lombardo, Huntington Station, N.Y., assignor to Cutler-Hammer, Inc., Milwaukee, Wis., a corporation of Delaware Filed June 20, 1961, Ser. No. 118,451
8 Claims. (Cl. 330—4.9)

This invention relates to parametric amplifiers.

Parametric amplifiers are now well known, and have been found useful because of their low-noise properties. Although such amplifiers have been the subject of extensive research and develpment, there is a continuing requirement for improvements yielding low-noise amplifiers with large gain-bandwidth products. In addition to this, it is also desirable to have an amplifier capable of being adjusted or tuned over a large signal bandwidth while maintaining a low noise figure and a large gain-bandwidth product.

The present invention is directed to the provision of an amplifier meeting the foregoing objectives, while at the same time being relatively simple in construction and having good operational stability.

In general, a parametric amplifier has a variable reactance component whose reactance is varied at a pump frequency higher than the signal frequency, and a signal is applied to the variable reactance to obtain amplification thereof. Commonly, a variable capacitance diode is employed as the variable reactance.

In the functioning of a parametric amplifier, a frequency equal to the difference between the pump and signal frequencies is developed. This is often called the "idler" frequency. In one mode of operation the pump frequency is approximately twice the signal frequency, so that the signal and idler frequencies are nearly the same. In another mode of operation, the pump frequency is considerably greater than twice the signal frequency, so that the signal and idler frequencies are quite widely separated. This latter mode of operation in general gives better noise performance, as well as other operating advantages. The present invention is particularly directed to this type of operation.

With the idler frequency considerably higher than the signal frequency, an amplified output signal can be obtained which has the same frequency as the input signal. It is also possible to obtain an amplified output signal at the idler frequency. In the specific embodiments hereinafter described, the output signal is at the same frequency as the input signal. However, it is possible to modify the arrangement shown to obtain an output at the idler frequency.

In a paper entitled "Optimum Noise and Gain-Bandwidth Performance for a Practical One-Port Parametric Amplifier," by J. C. Greene and E. W. Sard, Proceedings of the I. R. E., September 1960, pp. 1583–1590, a theory is presented giving conditions necessary for obtaining an optimum noise figure and a large gain-bandwidth product with a given variable-capacitance diode, and shows that there is an optimum pump frequency. While it is unnecessary to discuss these factors in detail, certain aspects may be mentioned briefly. For a low noise figure, it is desirable to avoid external idler circuit loading, and for a large gain-bandwidth product it is desirable to use the self-resonant frequency of the diode as the idler frequency.

A further problem in designing a satisfactory parametric amplifier is adequate isolation of the signal and idler frequencies. While many arrangements have been proposed, in general they involve a degradation of the gain-bandwidth product.

The present invention provides a relatively simple and practical arrangement in which external idler circuit loading may be avoided, the self-resonant frequency of the diode may be used as the idler frequency, and adequate isolation of signal and idler frequencies may be obtained.

In accordance with the invention, a variable-capacitance diode is provided in a circuit resonant at the idler frequency. Advantageously, the idler frequency is substantially equal to the self-resonant frequency of the diode. A circuit is then provided which shunts the diode circuit and is resonant at substantially the idler frequency so as to establish substantially a short-circuit across the diode circuit at the idler frequency. The signal input circuit is connected in series with the diode and shunting circuits, and contains an inductance tuned with the diode and shunting circuits to substantially series resonance at the signal frequency. Means are then provided for supplying pump frequency power to the diode. In this manner the idler circuit is substantially isolated from the signal circuit at the idler frequency, while at the same time the input signal is effectively applied across the diode.

Advantageously the amplifier employs coaxial transmission line components and the resonant circuit shunting the diode circuit is a quarter-wavelength transmission line section. The pump power is supplied through the quarter-wave transmission line section to the diode. Provision is made so that the pump presents a high source impedance to the quarter-wave section, thereby effecting substantially a short-circuit across the diode circuit at the idler frequency.

Although various structural arrangements may be provided for carrying out the principles of the invention, a specific structure is described hereinafter which has particular advantages.

Figures 1, 2, 3, 4:
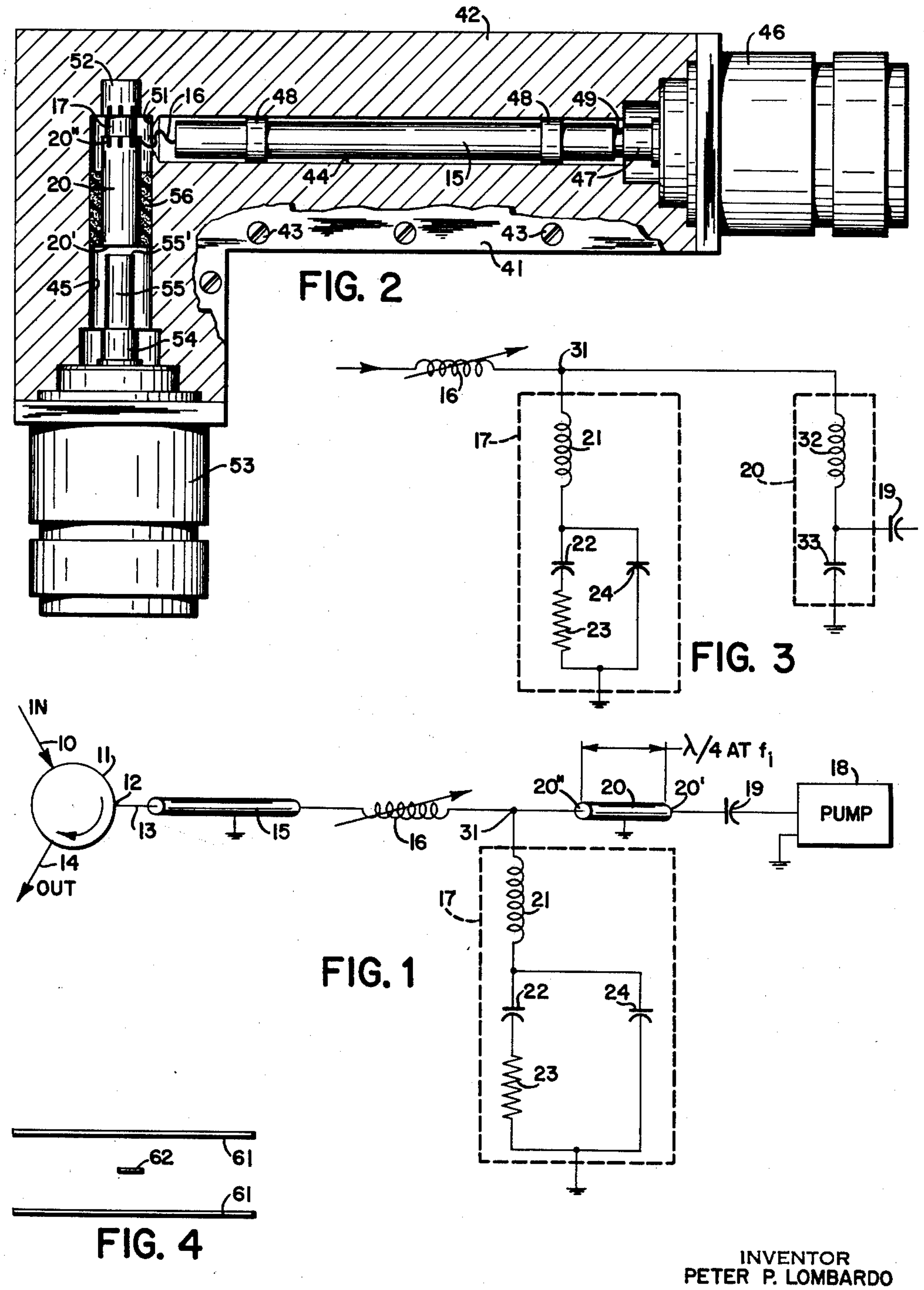
FIG. 1 is a schematic equivalent circuit of a parametric amplifier in accordance with the invention.
FIG. 2 is a structure in conformity with the schematic diagram of FIG. 1.
FIG. 3 is an explanatory equivalent circuit of a portion of FIG. 1.
FIG. 4 illustrates a cross-section of a strip transmission line which may be used in lieu of coaxial line.

Referring to FIG. 1, an input signal to be amplified is supplied to port 10 of a circulator 11, and thence from port 12 to line 13 for amplification. The amplified output signal in line 13 returns to the circulator through port 12 and is delivered to output port 14 of the circulator. Such circulators are well known in the microwave art and need not be described in detail.

An impedance matching coaxial-line section 15 is provided for reasons given hereinafter. The input signal is supplied through an adjustable inductance 16 to a variable-capacitance diode whose equivalent circuit is shown within dotted box 17. A source of pump power 18 is coupled through capacitor 19 and a coaxial line section 20 to the diode 17.

In the equivalent circuit 17 of the diode, inductance 21 is primarily the lead inductance, capacitance 22 is the junction capacitance which is varied by the pump frequency, resistance 23 represents the loss component and capacitance 24 is the stray capacitance. These parameters vary for different diodes and are affected by the manner in which the diode is mounted in use.

The junction capacitance 22 has an average value under pumped conditions which may be denoted $C_o$, and varies about this average value during the pump frequency cycle. The stray capacitance 24 may be denoted $C_s$. The inductance 21 will resonate with the sum of $C_o$ and $C_s$ at a frequency which may be termed the self-resonant frequency of the diode.

Advantageously the diode circuit from the point 31 to ground contains essentially only the diode impedance, and the self-resonant frequency of the diode is the idler frequency. Then, point 31 is effectively grounded at the idler frequency so that there is no external loading on the diode. The grounding of point 31 is accomplished by a circuit resonant at the idler frequency which establishes substantially a short-circuit across the diode circuit (point 31 to ground) at the idler frequency.

In FIG. 1 the resonant circuit comprises a transmission line section 20 which is substantially a quarter-wavelength long at the idler frequency. With substantially no loss in the transmission line section, an open circuit at end 20′ will establish a short-circuit at end 20″ which is connected to point 31.

In practice, there may be small losses in the transmission line. Also, end 20′ is not a completely open circuit, but is connected to the pump source 18 through coupling capacitor 19. However, the source impedance at end 20′ may be made sufficiently high so that point 31 is substantially short-circuited to ground. This may be accomplished by employing a pump source 18 with a high source impedance, or by making coupling capacitor 19 sufficiently small to provide a relatively high reactance at the idler frequency, or both.

The fact that a quarter-wavelength transmission line open-circuited at one end will be a short-circuit at the other end is known in the art. This effect is due to wave propagation through the line. The line has distributed inductance and capacitance, but may be represented by the equivalent circuit shown at 20 in FIG. 3. Here inductance 32 represents the effective inductance of the quarter-wave section, and capacitor 33 the effective capacitance. At resonance this forms a series resonant circuit to ground, and hence substantially short-circuits point 31 to ground.

In FIG. 3 the pump coupling capacitor 19 is shown as connected between elements 32 and 33, which is a convenient representation for purposes of understanding. With capacitor 19 small compared to the equivalent capacitance 33, only a small fraction of the available pump voltage will be supplied to point 31 and hence across the diode. For many applications this is satisfactory since sufficient pump power is available. If necessary additional tuned circuits may be introduced to provide for a more effective transfer of pump power to the diode, while at the same time maintaining a high impedance at 20′ at the idler frequency, as will be understood by those skilled in the art.

In order to effectively apply the signal voltage across the diode 17, the inductance 16 is tuned to produce series resonance with the diode and shunting circuit at the signal frequency. Since the signal frequency is considerably lower than the idler frequency, the inductive component 21 of the diode and the inductive component 32 of the quarter-wave section will be small at the signal frequency. Therefore the inductance 16 is essentially the inductance required to resonate with capacitors 22, 24 and 33 in parallel at the signal frequency. Due to this series resonance, the input signal voltage will be stepped up across the junction capacitance 22. The signal is then amplified due to the variation in the diode capacitance 22 produced by the pump frequency. The amplified signal at point 31 will pass through the input circuit components 16 and 15 to port 12 of the circulator, and will emerge at port 14.

Certain advantages of the arrangement of FIG. 1 will immediately be apparent. Inasmuch as point 31 is effectively grounded at the idler frequency, tuning of the signal input circuit by inductance 16 will have little or no effect on the tuning of the idler circuit. This greatly facilitates adjustment of the input circuit for best performance. Also, by changing the inductance of 16 for different input signal frequencies, and making a corresponding adjustment of the pump frequency to keep the idler frequency constant, the amplifier may be made to operate satisfactorily for signal frequencies over a wide range without changing the idler circuit.

In a given application there is usually an optimum value for the input signal source impedance. In a particular case this may be determined by measuring the performance of the amplifier with different signal source impedances, or by calculation. Usually circulators are designed to have an impedance matching the input and output lines connected thereto, and may not correspond to the optimum source impedance for the amplifier. In such case a transmission line section 15 may be employed for impedance matching. Section 15 is a quarter-wavelength long at the signal frequency, and has a characteristic impedance equal to the square root of the product of the circulator impedance and the desired source impedance for the amplifier. Such impedance matching is known in the art and need not be explained further.

If the input signal source impedance is sufficiently close to the desired impedance, or is made so, matching section 15 may be eliminated and the signal supplied directly to inductance 16.

The characteristic impedance of the transmission line section 20 may also be selected for optimum operation in a particular application. In general a low characteristic impedance is desirable for a wide idler bandwidth, whereas a high characteristic impedance is desirable for a wide signal bandwidth. Thus a compromise may be selected which gives the best overall performance in a particular case.

In general, for a given signal frequency, a high idler frequency is desirable for large gain-bandwidth products. Thus a variable-capacitance diode having a high self-resonant frequency is usually desirable, other factors being equal.

Referring now to FIG. 2, a physical embodiment is shown in conformity with the circuit diagram of FIG. 1. A metal housing is made in two pieces 41 and 42, fastened together by machine screws 43 to form a block. A pair of bores 44 and 45 in the housing form the outer conductors of coaxial line sections. Most of the upper piece 41 has been broken away to show the internal structure. The upper surface of 42 has section lines as though it were a section through a solid block. With the two parts screwed together, they in effect form a solid block, and the sectioning makes the drawing easier to understand.

The input signal is fed to the amplifier through a coaxial connector 46 of conventional design. The center conductor 47 of the connector is connected to the center conductor 15 forming the quarter-wave impedance matching section shown in FIG. 1. Conductor 15 is held in position by insulating members 48. The characteristic impedance is determined primarily by the ratio of the diameters of the center conductor and the bore 44. Since this is different from the characteristic impedance of the input coupling 46, a suitable transition section 49 is provided.

Cylindrical bores 44 and 45 are at right angles and intersect to provide an opening 51. Diode 17 is mounted near the intersection and is held in place by spring fingers on plug 52 which is secured in block member 42.

Pump frequency power is supplied through a coaxial connector 53 to coaxial line sections 54 and 55 in which the diameter of the bore is stepped down with a corresponding stepping down of the diameter of the center conductor to maintain the same characteristic impedance.

The quarter-wave section 20 is held in place in bore 45 by a sleeve 56 of low-loss dielectric such as foam polyethylene. The ratio of the diameters of the center conductor 20 and the bore 45 is selected to provide the desired characteristic impedance. The end 20″ is provided with spring fingers to grip the adjacent end of diode 17. The inductance 16 is formed by a bent wire connected between the end of section 15 and the end 20″ of section 20, or directly to the diode 17. The inductance is adjustable by bending the wire. Also, a different diameter wire may be substituted to provide an adjustable inductance in a different range. The coupling capacitor 19 is formed by the juxtaposed ends 55′ of the pump input center conductor and 20′ of the quarter-wave section.

In use, the structure shown in FIG. 2 will be connected to a circulator through coupling 46 and to a source of pump frequency power through coupling 53.

It will be noted that this structure is mechanically simple and rugged. By removing the upper section 41, inductance 16 may be varied until the desired value is obtained for the particular signal frequency to be amplified.

In this particular embodiment no provision is made for rapid tuning of inductance 16. However, it can be replaced by a suitable tunable inductance if rapid tuning is a requirement. In such case the quarter-wave matching section 15 may be arranged to be tunable, or it may be eliminated by providing a suitable signal source impedance as mentioned above, or a broad-band matching section employed.

The coaxial line type structure such as shown in FIG. 2 is preferred. However, the arrangement can also be formed in strip transmission line if desired. FIG. 4 shows a cross-section of a strip transmission line including a pair of extended ground planes 61 with a center conductor 62. Various means are known in the art for supporting conductor 62 midway between the ground planes. The center conductor 62 may be cut into sections to yield quarter-wavelength elements, and the width and thickness varied to give different characteristic impedances, as is well known in the art. Both the coaxial and strip transmission line structures use the TEM mode of propagation, and hence may be termed TEM structures.

As mentioned above, instead of extracting the amplified output signal at the input signal frequency, it may be extracted at the idler frequency. This has the advantage of a fixed output frequency. The short-circuiting quarter-wave section 20 carries a substantial current at the idler frequency, and a corresponding substantial voltage exists at the end 20′ thereof. Thus current or voltage probes may be employed to obtain an output at the idler frequency. Or, a circulator may be employed between the pump source 18 and connector 53, in a manner similar to that shown for circulator 11 in FIG. 1. Thus the pump source may be connected to an input port and the intermediate port may be connected to 53. The idler signal coupled to connector 53 through capacitor 19 will then appear at the output port of the circulator. These and other expedients will be understood by those skilled in the art and need not be described in detail. In extracting the signal, it is advantageous to avoid excessive loading of the idler circuit.

The right angle relationship of the coaxial line sections shown in FIG. 2 has been found very satisfactory and is preferred. However, if desired, other relationships may be employed.

The invention has been described in connection with a specific embodiment thereof. It will be understood that modifications thereof may be made within the spirit and scope of the invention.

In the claims the term "non-linear" is employed in the sense that the diode is a non-linear circuit element whose capacitance varies with the pump frequency. The variation in capacitance as a function of, say, pump voltage, does not necessarily have to be non-linear although it commonly is at the present time.

I claim:

1. In a parametric amplifier, the combination which comprises a non-linear variable-capacitance diode circuit resonant at a predetermined idler frequency substantially higher than the input signal frequency, a circuit shunting said diode circuit and resonant at substantially the idler frequency for establishing substantially a short-circuit across the diode circuit at the idler frequency, a signal input circuit in series with said diode and shunting circuits, an inductance in said signal input circuit tuned to produce substantially series resonance with the diode and shunting circuits at the signal frequency, and means for supplying pump frequency power to the diode at a pump frequency high compared to said input signal frequency and yielding a difference therefrom equal to said predetermined idler frequency.

2. In a parametric amplifier, the combination which comprises a non-linear variable-capacitance diode circuit resonant at a predetermined idler frequency substantially higher than the input signal frequency, a transmission line section connected at one end to said diode circuit, the length of the transmission line section being substantialy a quarter-wavelength at the idler frequency and the other end thereof being at a high impedance at the idler frequency to establish substantially a short-circuit across the diode circuit at the idler frequency, a signal input circuit connected to said diode circuit and including an inductance tuned to produce substantially series resonance with the diode circuit and transmission line section at the signal frequency, and means for supplying pump frequency power to the diode at a pump frequency high compared to said input signal frequency and yielding a difference therefrom equal to said predetermined idler frequency.

3. In a parametric amplifier, the combination which comprises a non-linear variable capacitance diode circuit resonant at a predetermined idler frequency substantially higher than the input signal frequency, a pump frequency power source for supplying a pump frequency high compared to said input signal frequency and yielding a difference therefrom equal to said predetermined idler frequency, a transmission line section connected at one end to said diode circuit and at the other end to the pump power source, the length of the transmission line section being substantially a quarter-wavelength at the idler frequency and the source impedance of the pump power source at the transmission line section being high at the idler frequency to establish substantially a short-circuit across the diode circuit at the idler frequency, and a signal input circuit connected to the junction of the diode circuit and the transmission line section, said signal input circuit including an inductance tuned to produce substantially series resonance with the capacitances of the diode circuit and transmission line section at the signal frequency.

4. In a parametric amplifier, the combination which comprises an input signal circuit including an inductance, a pump frequency power source, a non-linear variable-capacitance diode having a self-resonant frequency substantially higher than the input signal frequency, said pump frequency being high compared to the input signal frequency and yielding an idler frequency substantially equal to the self-resonant frequency of the diode, and a transmission line section connected at one end to said diode and at the other end to the pump power source, the length of the transmission line section being substantially a quarter-wavelength at the idler frequency and the source impedance of the pump power source at the transmission line section being high at the idler frequency to establish substantially a short-circuit across the diode at the idler frequency, said input signal circuit being connected to the junction of the diode and transmission line section and the inductance thereof being tuned to produce substantially series resonance with the diode and transmission line capacitances at the signal frequency.

5. In a parametric amplifier, the combination which comprises an input signal circuit including an inductance, a pump frequency power source, a non-linear variable-capacitance diode having a self-resonant frequency substantially higher than the input signal frequency, said pump frequency being high compared to the input signal frequency and yielding an idler frequency substantially equal to the self-resonant frequency of the diode, a TEM-type transmission line section connected at one end to the diode, a capacitor coupling the other end of the transmission line section to the pump power source, the length of the transmission line section being substantially a quarter-wavelength at the idler frequency and the impedance of said capacitor and pump power source being high at the idler frequency to establish substantially a short-circuit across the diode at the idler frequency, said input signal circuit being connected to the junction of the diode and transmission line section and the inductance thereof being tuned to produce substantially series resonance with the diode and transmission line capacitances at the signal frequency.

6. In a parametric amplifier for operating at a pump frequency which is high compared to the input signal frequency to yield an idler frequency substantially higher than the signal frequency, the combination which comprises an input signal coaxial line section and an inductance in series therewith, a pump frequency coaxial line section, a non-linear variable-capacitance diode self-resonant at substantially said idler frequency, and a coaxial line section substantially a quarter-wavelength long at said idler frequency, one end of the quarter-wavelength section and said inductance being connected to one terminal of said diode, the other end of the quarter-wavelength section being adjacent to and spaced from said pump frequency coaxial line section to form a capacitance coupling therewith, said capacitance coupling having a high reactance at the idler frequency whereby substantially a short-circuit is established across the diode at said idler frequency, and said inductance being tuned to produce substantially series resonance with the capacitances of the diode and quarter-wavelength section at said signal frequency.

7. In a parametric amplifier for operating at a pump frequency which is high compared to the input signal frequency to yield an idler frequency substantially higher than the signal frequency, the combination which comprises a metal housing having a pair of bores therein forming outer conductors of respective coaxial lines, the bores intersecting interiorly of the housing, a non-linear variable-capacitance diode mounted near the intersection with one terminal thereof grounded to the housing, said diode being self-resonant at substantially said idler frequency, a center conductor in one of said bores forming an input signal coaxial line section, an inductance connecting the inner end of said conductor with the other terminal of the diode, a center conductor in the other of said bores substantially a quarter-wavelength long at said idler frequency and connected at one end to said other terminal of the diode, and a center conductor in said other bore spaced from the quarter-wavelength conductor to form a capacitive coupling therewith, the last-mentioned center conductor forming a coaxial line section for supplying pump frequency power to the diode through the quarter-wavelength section, said capacitance coupling having a high reactance at said idler frequency whereby substantially a short-circuit is established across the diode at the idler frequency, and said inductance being tuned to produce substantially series resonance with the capacitances of the diode and quarter-wavelength section at said signal frequency.

8. Apparatus in accordance with claim 7 in which said pair of bores are substantially perpendicular to each other, and the metal housing is a block formed of at least two pieces mating to form the bores.

References Cited in the file of this patent

UNITED STATES PATENTS

| | | |
|---|---|---|
| 3,022,466 | Weiss | Feb. 20, 1962 |
| 3,040,267 | Seidel | June 19, 1962 |

OTHER REFERENCES

Chang et al.: "Proceedings of the IRE," July 1958, pages 1383–1386.

Harris: "CQ," November 1958, pages 74, 75, 159, 164, 168.